US010739414B2

(12) United States Patent
Gubba Ravikumar et al.

(10) Patent No.: US 10,739,414 B2
(45) Date of Patent: *Aug. 11, 2020

(54) DETERMINING STATUS OF ELECTRIC POWER TRANSMISSION LINES IN AN ELECTRIC POWER TRANSMISSION SYSTEM

(71) Applicant: Schweitzer Engineering Laboratories, Inc., Pullman, WA (US)

(72) Inventors: Krishnanjan Gubba Ravikumar, Pullman, WA (US); Ashish Upreti, Pullman, WA (US); Bharath Nayak, Pullman, WA (US); Yusuf Zafer Korkmaz, Istanbul (TR)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 543 days.

This patent is subject to a terminal disclaimer.

(21) Appl. No.: 15/393,618

(22) Filed: Dec. 29, 2016

(65) Prior Publication Data

US 2017/0108542 A1    Apr. 20, 2017

Related U.S. Application Data

(62) Division of application No. 14/493,631, filed on Sep. 23, 2014, now Pat. No. 9,568,516.

(51) Int. Cl.
*G01R 31/02* (2006.01)
*G01R 31/58* (2020.01)
(Continued)

(52) U.S. Cl.
CPC ......... *G01R 31/58* (2020.01); *G01R 19/0092* (2013.01); *G01R 21/00* (2013.01);
(Continued)

(58) Field of Classification Search
CPC .. G01R 21/00; G01R 31/021; G01R 19/0092; G01R 31/08; G01R 31/085; G01R 31/088; G01R 31/11
See application file for complete search history.

(56) References Cited

U.S. PATENT DOCUMENTS

| | | | |
|---|---|---|---|
| 4,581,705 A * | 4/1986 | Gilker | G01R 19/02 324/76.11 |
| 5,550,476 A * | 8/1996 | Lau | G01R 15/142 324/509 |

(Continued)

*Primary Examiner* — Mohamed Charioui
*Assistant Examiner* — Eyob Hagos
(74) *Attorney, Agent, or Firm* — Jared L. Cherry; Richard M. Edge

(57) ABSTRACT

The present application discloses systems and methods to determine loss of at least one electric power transmission line in an electric power transmission system. In various embodiments, a system consistent with the present disclosure may include an electrical parameter monitoring subsystem configured to receive electrical parameter measurements and to determine a change of the electrical measurements. An analysis subsystem may determine whether a change in the electrical measurements is indicative of loss of at least one transmission line and may calculate a number of transmission lines lost based on the change. In some embodiments, a remedial action subsystem may be configured to implement a remedial action in response to loss of at least one transmission line. The number of transmission lines lost may be determined based on an angle difference ratio and a power ratio between two buses in electrical transmission system.

11 Claims, 7 Drawing Sheets

(51) Int. Cl.
  *G01R 21/00* (2006.01)
  *G01R 19/00* (2006.01)
  *H02H 3/253* (2006.01)
  *H02J 13/00* (2006.01)
  *G01R 31/50* (2020.01)
  *G01R 19/25* (2006.01)

(52) U.S. Cl.
  CPC ............ *G01R 31/50* (2020.01); *H02H 3/253* (2013.01); *H02J 13/0006* (2013.01); *G01R 19/2513* (2013.01)

(56) References Cited

U.S. PATENT DOCUMENTS

| | | | | |
|---|---|---|---|---|
| 9,366,715 B2* | 6/2016 | Ukil | ........................ | G01R 31/08 |
| 2009/0115427 A1* | 5/2009 | Radtke | ................... | G01R 27/16 |
| | | | | 324/629 |
| 2009/0284324 A1* | 11/2009 | Van Quach | .......... | H05K 1/0237 |
| | | | | 333/34 |
| 2010/0295492 A1* | 11/2010 | Chakrabarti | .......... | B60L 3/0038 |
| | | | | 318/490 |
| 2011/0082654 A1* | 4/2011 | Dickens | .................... | H02J 3/24 |
| | | | | 702/60 |
| 2013/0088239 A1* | 4/2013 | Mynam | ................ | G01R 31/085 |
| | | | | 324/509 |
| 2014/0253102 A1* | 9/2014 | Wood | ..................... | G01R 1/203 |
| | | | | 324/140 R |
| 2015/0212139 A1* | 7/2015 | Smith | .................. | G01R 31/025 |
| | | | | 324/509 |
| 2015/0226780 A1* | 8/2015 | Sun | ...................... | G01R 31/088 |
| | | | | 702/59 |
| 2015/0325336 A1* | 11/2015 | Maples | .................. | D07B 1/147 |
| | | | | 324/539 |
| 2017/0052222 A1* | 2/2017 | Pasdar | ................. | G01R 31/021 |

* cited by examiner

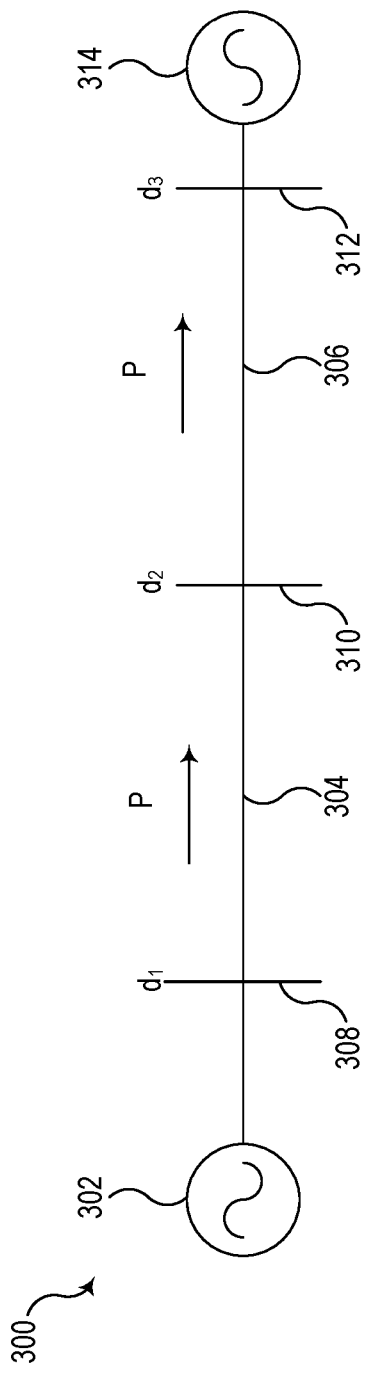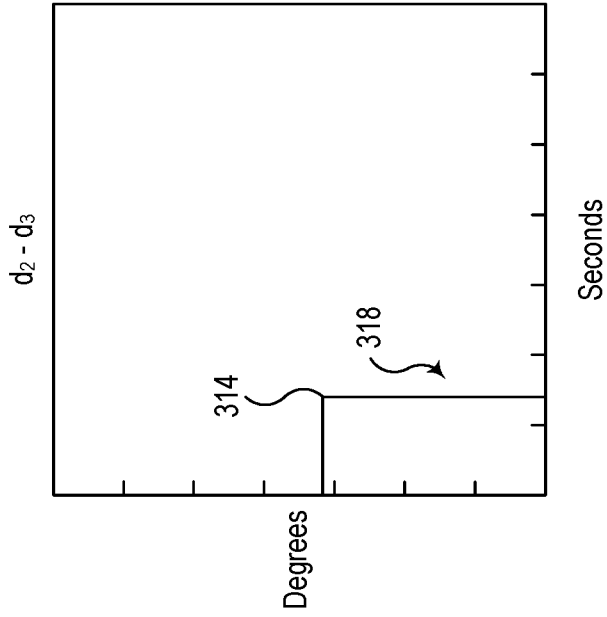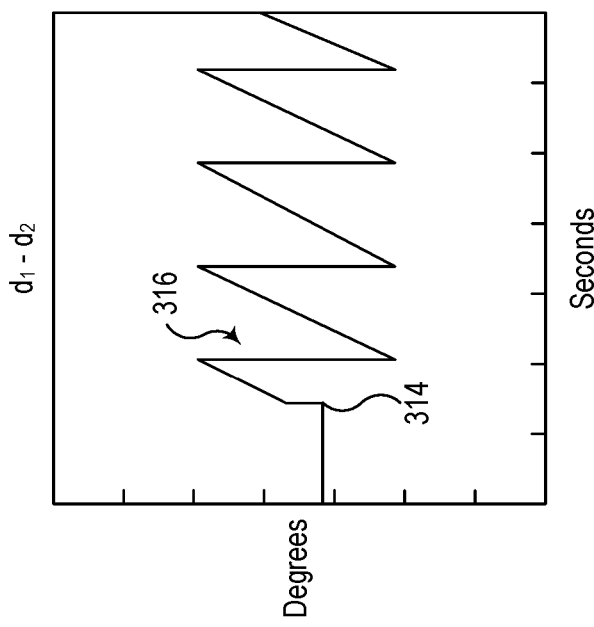
Figure 3A
Figure 3C
Figure 3B

DETERMINING STATUS OF ELECTRIC POWER TRANSMISSION LINES IN AN ELECTRIC POWER TRANSMISSION SYSTEM

RELATED APPLICATIONS

The present application claims priority under 35 U.S.C. §§ 120 and 121 as a divisional application of U.S. patent application Ser. No. 14/493,631 filed on 23 Sep. 2014, titled "Determining Status of Electric Power Transmission Lines in an Electric Power Transmission System", and naming Krishnanjan Gubba Ravikumar, Ashish Upreti, B. Nayak, and Yusuf Zafer Kormaz as inventors, which is hereby incorporated by reference in its entirety.

TECHNICAL FIELD

This disclosure relates to techniques that may be utilized to determine the status of electric transmission lines in electric power transmission systems. More particularly, but not exclusively, the present disclosure relates to systems and methods configured to detect loss of parallel transmission lines based on a measured electric parameter between two or more transmission buses and without reference to a fixed threshold.

BRIEF DESCRIPTION OF THE DRAWINGS

Non-limiting and non-exhaustive embodiments of the disclosure are described, including various embodiments of the disclosure with reference to the figures, in which:

FIG. 3A illustrates a one-line diagram of an electric power delivery system with two transmission lines disposed between three transmission buses consistent with embodiments of the present disclosure.

FIG. 3B illustrates a graph over time showing an angle equal to a difference between the first transmission bus and the second transmission bus in the one-line diagram shown in FIG. 3A before and after the transmission line between the first and second transmission buses is taken out-of-service.

FIG. 3C illustrates a graph over time showing an angle equal to a difference between the second transmission bus and the third transmission bus in the one-line diagram shown in FIG. 3A before and after the transmission line between the second and third transmission buses is taken out-of-service.

Figure 1:
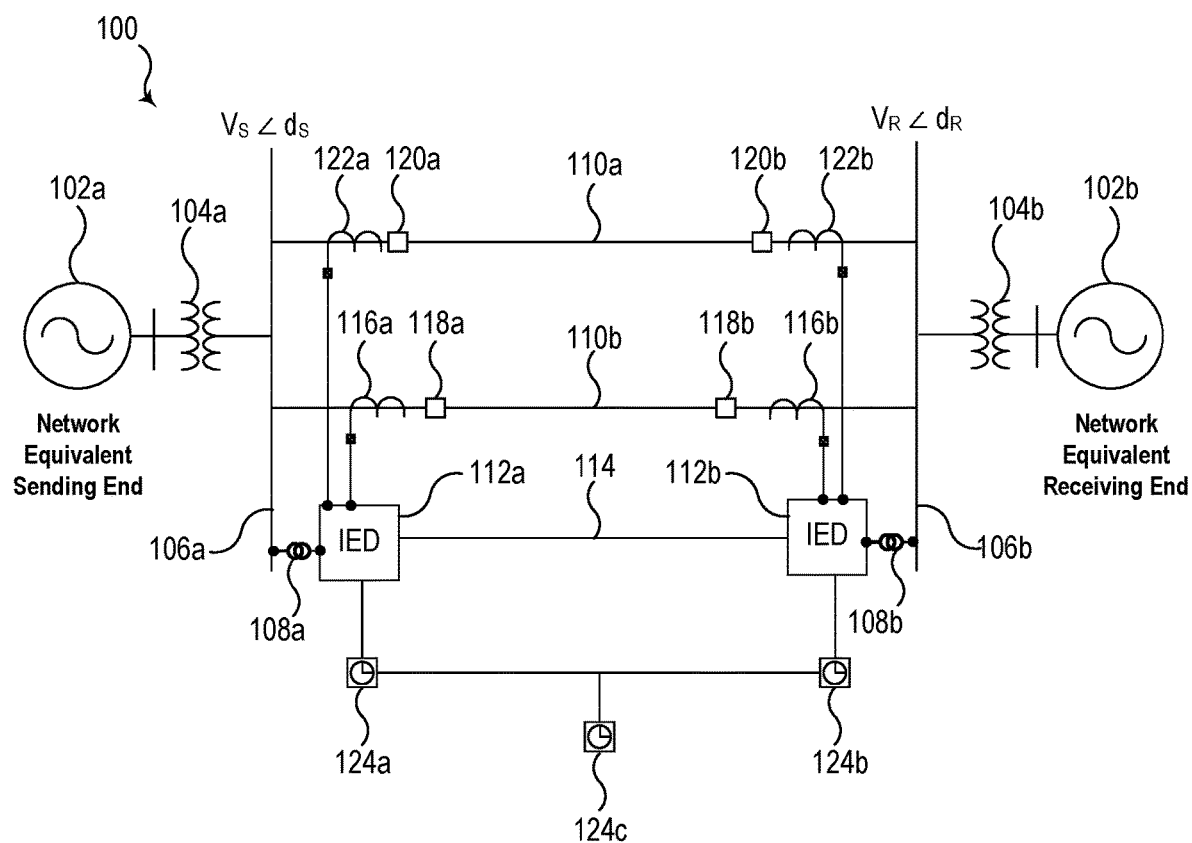
FIG. 1 illustrates an example of an embodiment of a simplified one-line diagram of an electric power delivery system with parallel transmission lines consistent with embodiments of the present disclosure.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

In order to increase the reliability of electric power transmission systems, parallel transmission lines may be used. Parallel lines may allow for transmission of electric power to continue while one of the lines is out-of-service. One of the lines may be taken out-of-service intentionally (e.g., to perform maintenance, repairs, or the like) or may be taken out-of-service by an unplanned event (e.g., a weather disturbance, an accident, equipment failure, etc.). Delivery of electric power may be interrupted in the event that both of the lines are taken out-of-service at the same time, whether the lines are taken out-of-service intentionally or unintentionally.

Detecting a loss of one of the parallel lines may be achieved using at least two general techniques. First, the status of the line (e.g., whether the line is in-service or out-of-service) may be determined by monitoring the status of connecting devices (e.g., breakers, reclosers, etc). An indication of a status change may be communicated when a connecting device changes state (e.g., changes from a closed or conducting state to an open state). Based on an analysis of such connecting devices, the status of a transmission line may be determined. Systems relying on state information to detect loss of a transmission line may be referred to herein as state-based detection systems. Second, the status of a line may be determined by monitoring various electric parameters associated with the line, such as the voltage, current, and/or angle differences. Changes in such electric parameters may provide an indication that the status of the line has changed. Systems relying on measurements of electric parameters to detect loss of a transmission line may be referred to herein as measurement-based detection systems. Certain regulatory agencies may require that parallel transmission lines be monitored using both a state-based detection system and a measurement-based detection system. Use of both types of systems may improve the likelihood of detecting a change in the state of the parallel transmission lines.

Measurement-based detection systems may utilize voltage angle difference schemes for detecting the loss of a parallel transmission line. A voltage angle difference scheme may determine the relative angle between two locations in the electric power transmission system. In certain instances a static and preset angle difference threshold may be specified for open line detection, which in turn results in selectively disconnecting power system assets (e.g., generators, loads, etc.) to maintain stability of the system. Static and preset angle difference threshold values may require study by an engineer to set appropriately. Further, such a threshold may be set too high to avoid false tripping, but thereby making the system slower to respond. Still further, static and preset thresholds cannot dynamically adapt for changes in power flow. In some circumstances, reliance on static and preset thresholds may not be sufficient to maintain transient stability in an electric power transmission system.

Embodiments consistent with the present disclosure may be configured to meet arbitrary critical clearing time requirements. Some embodiments consistent with the present disclosure may further be configured to operate without the use of predetermined or static thresholds. Accordingly, such systems may avoid the need for engineering studies aimed at identifying an appropriate threshold.

In various embodiments, a system consistent with the present disclosure may monitor the currents flowing through parallel transmission lines connecting two buses. The system may analyze the positive sequence voltage angle (V1 angle) difference between the two buses. There could be a case where an external event might mislead the algorithm to take a false decision. To avoid such cases and provide more security to the scheme, the algorithm will monitor the positive sequence current magnitudes to properly identify the switching event between the buses of interest. This current based condition can be used as arming logic before allowing the algorithm to declare open line condition. In one specific embodiment, the arming logic may compare a positive sequence current to a threshold. The threshold may be selected to be equal to or greater than a minimum charging current of the line. In other embodiments, the arming logic may calculate power ratios between parallel transmission lines, and may selectively enable the algorithm based on changes in the monitored current ratio.

Also, since the algorithm assumes parallel transmission lines with same line impedances, the currents measured at each end can be used to alarm for an open line condition using current ratios. A change in current ratio between parallel transmission lines (with same impedance) can only occur when one of the lines is taken out-of-service. This type of open line detection alarming may help operators of the electric power transmission system to identify transmission lines that have been taken out-of-service.

In some embodiments a dynamically adjustable threshold-based approach may be used. In such embodiments, a dynamically adaptable threshold may be used to satisfy an arbitrary time requirement open line detection. In such embodiments, the dynamic adjustment of a threshold may be based on the rate of change of angle difference or the rate of change of power flow. As long as this rate of change is within a specified range, the threshold may be moved proportionally to the increase in angle difference. If the rate of change exceeds the prescribed threshold, the angle difference threshold may remain static and may issue an open line declaration. In various embodiments, a standing angle difference may be measured and a constant margin above this level may be used as a detection threshold as long as the rate of change remains within an acceptable range.

Modern automation, electric power transmission, and distribution systems typically include intelligent electronic devices ("IEDs") for protection, control, automation, and/or monitoring of equipment in the system. IEDs may be used to monitor equipment of many types, including electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. In various embodiments consistent with the present disclosure, IEDs may be used in connection with the systems and methods disclosed herein.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electric, magnetic, and electromagnetic interaction. Two components may be connected to each other, even though they are not in direct physical contact with each other and even though there may be intermediary devices between the two components.

Some of the infrastructure that can be used with embodiments disclosed herein are already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order.

In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates an example of an embodiment of a simplified one-line diagram of an electric power delivery system 100 with parallel transmission lines 110*a*, 110*b* consistent with embodiments of the present disclosure. Electric power delivery system 100 may be configured to generate, transmit, and distribute electric energy to loads.

Electric power delivery systems may include equipment, such as electric generators (e.g., generators 102a, 102b), power transformers (e.g., transformers 104a, 104b), transmission lines (e.g., lines 110a, 110b), circuit breakers (e.g., breakers 118a, 118b and 120a, 120b), busses (e.g., busses 106a, 106b) and the like. A variety of other types of equipment may also be included in electric power delivery system 100, such as voltage regulators, capacitor banks, loads, and a variety of other types of equipment that are not specifically illustrated.

Electric power delivery system 100 may be monitored, controlled, automated, and/or protected using intelligent electronic devices (IEDs) 112a, 112b. As used herein, an IED (such as IEDs 112a, 112b) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

IEDs 112a, 112b may communicate over various media such as a direct communication link 114 or over a wide-area communications network (not shown). Communication link 114 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

A common time signal may be distributed throughout system 100. The time signal may be generated by multiple independent time sources, 124a, 124b, 124c or may be generated using a single time source. Time sources 124a, 124b, 124c may ensure that IEDs 112a, 112b have a synchronized time signal that can be used to generate time synchronized data, such as synchrophasors. The time signal may be distributed in system 100 using a communications network or using a universal time source, such as a global navigation satellite system, or the like.

IEDs 112a, 112b may monitor currents in transmission line 110a using current transformers 122a, 122b, respectively; and IEDs 112a, 112b may monitor currents in transmission line 110b using current transformers 116a, 116b. IEDs 112a, 112b may utilize voltage transformers 108a, 108b to monitor voltages on busses 106a, 106b. Consistent with various embodiments of the present disclosure, the voltages and/or currents may be analyzed to determine the status of the transmission lines 110a, 110b using various algorithms described herein. Further, the voltages and/or currents may be communicated via communication link 114 for analysis from both sides of transmission lines 110a, 110b. In the event of a loss of communication between IEDs 112a, 112b, analysis may be limited to locally available information gather by either IED 112a or IED 112b.

When one of the transmission lines 110a, 110b is removed from service, an angle difference between buses 106a, 106b may change. As described in greater detail below, the angle difference between the buses may initially spike when one of the transmission lines 110a, 110b is taken out-of-service. Following the initial spike, the angle difference may oscillate until settling at a new steady state value. Analysis of change in the angle may provide an indication that one of the transmission lines 110a, 110b has been taken out-of-service. In electric power transmission systems having two or more parallel transmission lines, analysis of the initial spike may be utilized to determine how many lines have been taken out-of-service between the two buses. When a loss of communication prevents transmission of data between IEDs 112a, 112b, a determination that one of transmission lines 110a, 110b has been taken out of service may be based on a change in the ratio of the current flowing in the one transmission line to the current flowing in the other transmission line.

The total real power transfer across the two parallel transmission lines can be represented mathematically using Eq. 1.

$$P = \frac{|V_S| * |V_R| * \sin(\delta_S - \delta_R)}{jX_L} \quad \text{Eq. 1}$$

Where:
P is the power transmission value;
$V_S$ is the voltage at the source terminal;
$V_R$ is the voltage at the remote terminal;
$\delta_S$ is;
$\delta_R$ is; and,
$X_L$ is the line reactance.

For a fixed power transmission value (P) and assuming that the transmission lines 110a, 110b have the same impedance, if one parallel transmission line is taken out-of-service, the line reactance $jX_L$ is doubled (assuming both the parallel lines have the same impedance). Accordingly, the angle must double to maintain the same power value.

Figure 2:
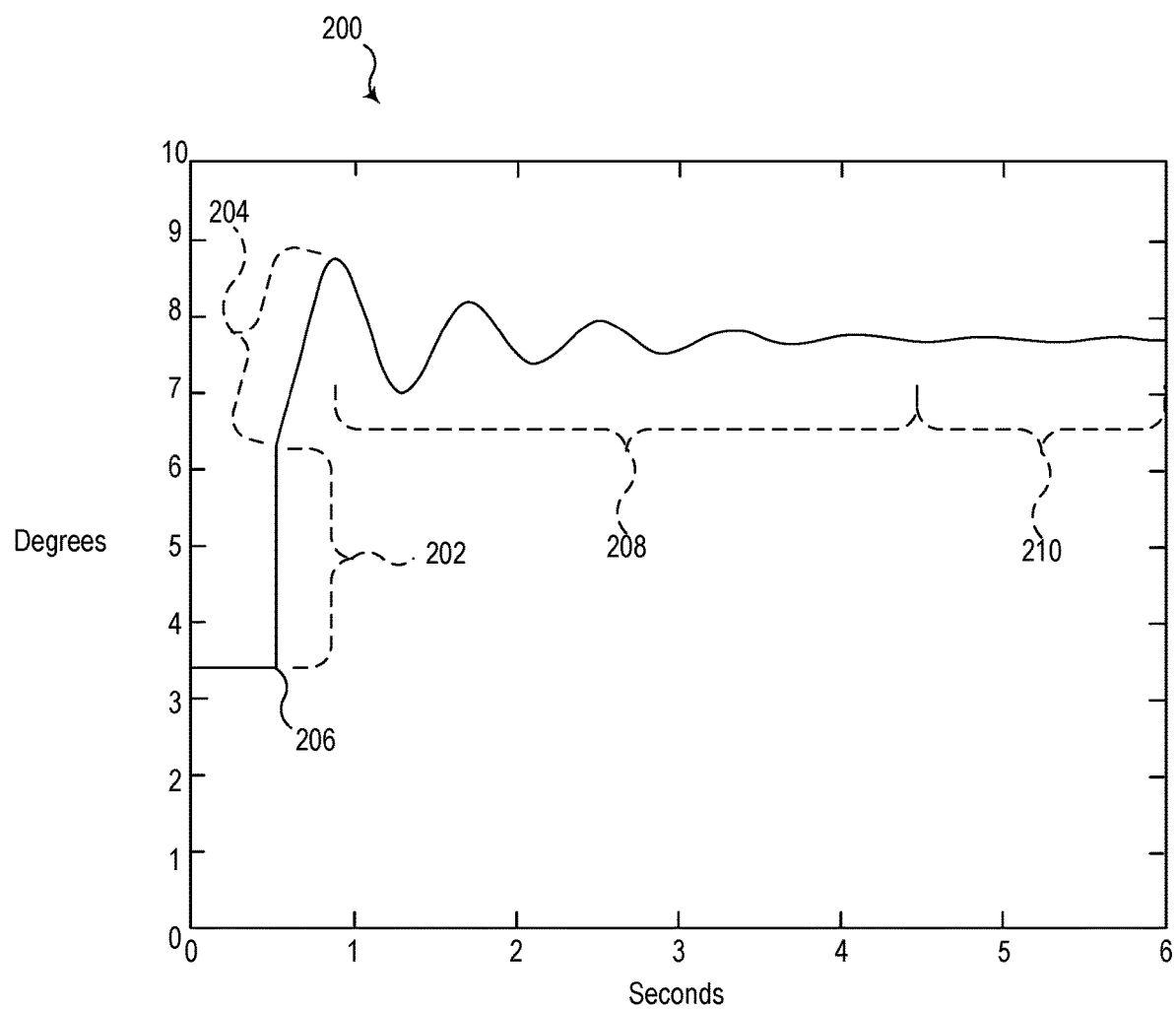
FIG. 2 illustrates a plot over time of an angle difference between the buses in FIG. 1, before and after a transmission line is taken out-of-service consistent with embodiments of the present disclosure.

FIG. 2 illustrates a plot 200 over time of an angle difference between the buses 106a, 106b in FIG. 1, before and after a transmission line is taken out-of-service consistent with embodiments of the present disclosure. The characterization and tracking of an initial jump 202 following the loss of a transmission line at time 206 may be performed by measuring the rate of change of angle difference in a short time following the loss of a parallel transmission line. Once the initial jump 202 occurs in the angle difference, the angle difference may continue to increase at a reduced rate of change 204. Determining a continuing rise in the angle difference 204 may help to filter out transients in angle difference measurement. In one specific embodiment, the initial jump may be characterized by a very high rate of change of angle (or power flow). In one embodiment, the power flow may be in upwards/positive direction. For continuing rise, the rate of change of angle (or power flow) is greater than zero but the rate itself is much smaller than the rate that we use to identify the initial spike. For example, the initial jump rate of change may exceed 300 degrees per second and the continuing rate of change may exceed 20 degrees per second. After reaching a maximum value, a period of oscillations 208 may follow before the oscillations settle to a new steady state value 210.

The angle difference before the start of the second rate of change 204 along with the angle difference prior to the loss of the transmission line at time 206 can be used to calculate an angle difference ratio. The angle difference ratio, $A_R$, is defined in Eq. 2.

$$A_R = \frac{\text{Final value of Angle diff. jump immediately after the event}}{\text{Angle diff. before the event}} \quad \text{Eq. 2}$$

When the rate of change of the angle difference changes, the angle difference before and after the event may be determined. A power ratio, $P_R$, which is defined in Eq. 3, may then be determined based on the net power flow between the two buses before and after the event.

$$P_R = \frac{\text{Net Power flow between the two buses before the event}}{\text{Net Power Flow between the two buses immediately after the event}} \quad \text{Eq. 3}$$

With the angle difference ratio and the real power ratio, the number of parallel lines taken out-of-service may be determined. More specifically, the power ratio multiplied by the angle difference ratio provides an indication of the change in the equivalent impedance as a result of the loss of one or more transmission lines. This relationship is set forth in Eq. 4.

$$\|P_R * A_R\| = \text{Number of Lines Lost} \quad \text{Eq. 4}$$

The result of Eq. 4 is an integer, since the number of transmission lines lost is an integer.

FIG. 3A illustrates a one-line diagram of an electric power delivery system 300 with two transmission lines 304, 306 disposed between three transmission buses 308, 310, 312 consistent with embodiments of the present disclosure. An equivalent source 302 is configured to generate a flow of electric current through transmission lines 304, 306 to be absorbed by another equivalent source 314. Electric power delivery system 300 is a radial system with only one physical connection between bus 1 and bus 3 (i.e., serial transmission lines 304 and 306). In a radial system, such as electric power delivery system 300, if one of the transmission lines is open, the current flow through the remaining lines become zero and it may be difficult to detect open line conditions for each of the transmission lines. These difficulties, however, may be overcome using the systems and methods disclosed herein.

FIG. 3B illustrates a graph showing a plot of an angle 316 equal to a difference between a first transmission bus 308 and the second transmission bus 310 in the electric power delivery system 300 before and after transmission line 304 is taken out-of-service at time 314. The angle difference wraps between −180° and 180°. The result indicates that two islands have formed and the power system has physically split into two segments.

FIG. 3C illustrates a graph over time showing an angle 318 equal to a difference between the second transmission bus 310 and the third transmission bus 312 in the one-line diagram shown in FIG. 3A before and after the transmission line 304 is taken out-of-service. As illustrated in FIG. 3C, the power across transmission line 306 becomes zero at time 316 as a result of transmission line 304 being taken out-of-service. Typical low power/low current based detection schemes may fail under such a scenario for open line detection.

Figure 4A:
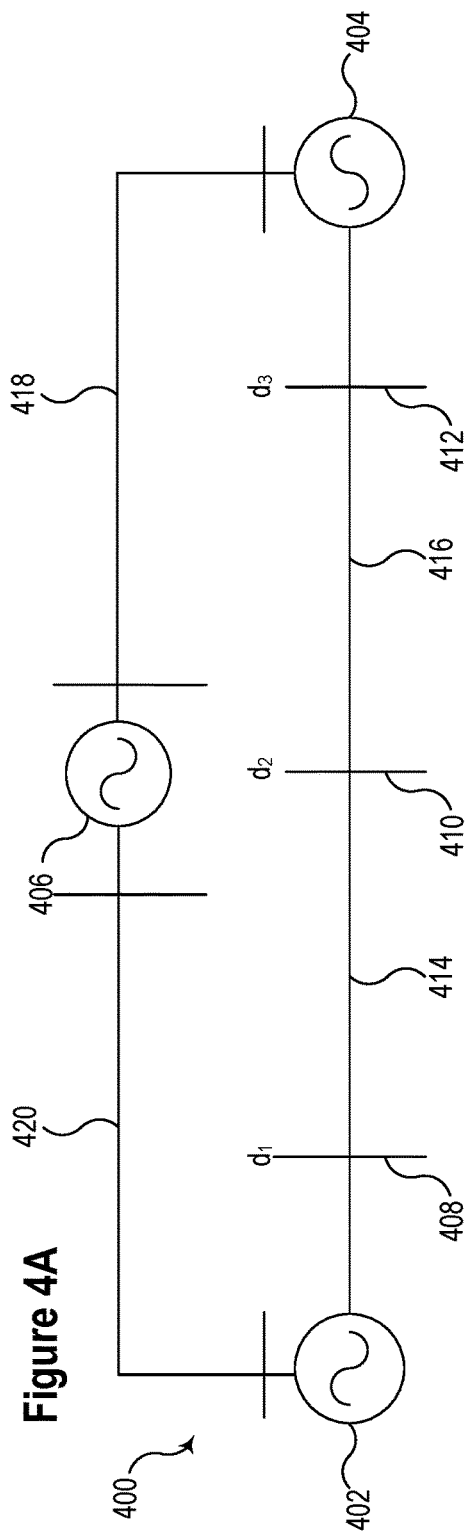
FIG. 4A illustrates a one-line diagram of an electric power delivery system with multiple connection paths disposed between three transmission buses consistent with embodiments of the present disclosure.

FIG. 4A illustrates a one-line diagram of an electric power delivery system 400 with multiple connection paths disposed between three transmission buses 408, 410, 412 consistent with embodiments of the present disclosure. Generators 402, 404, 406 are configured to generate a flow of electric current through transmission lines 414, 416, 418, 420. Electric power delivery system 400 is configured such that power may be delivered to transmission buses 408, 410, 412 when one of transmission lines 414, 416, 418, 420 is out-of-service.

Figure 4C:
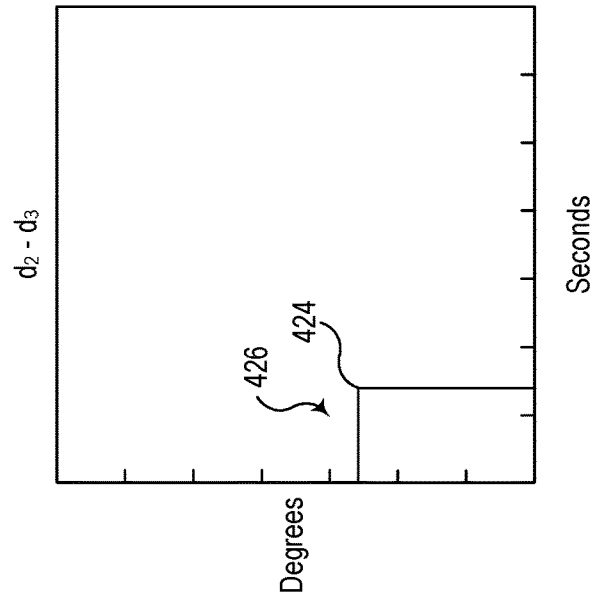
FIG. 4C illustrates a graph over time showing an angle equal to a difference between the second transmission bus and the third transmission bus in the electric power delivery system shown in FIG. 4A.
Figure 4B:
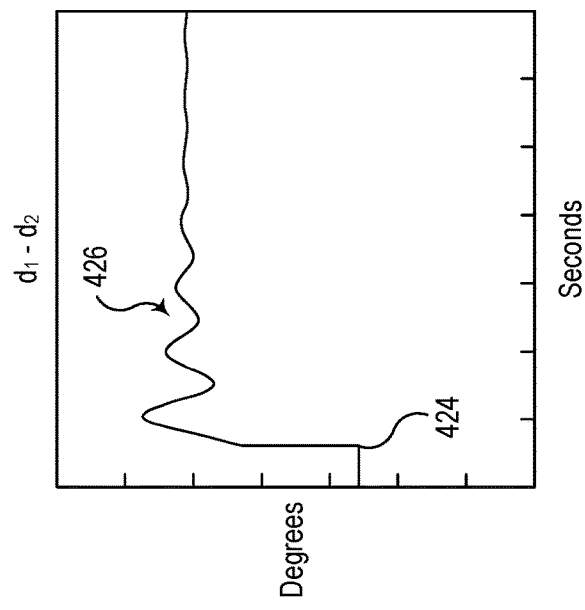
FIG. 4B illustrates a graph showing a plot of an angle equal to a difference between the first transmission bus and the second transmission bus in the electric power delivery system illustrated in FIG. 4A.

FIG. 4B illustrates a graph showing a plot of an angle 426 equal to a difference between the first transmission bus 408 and the second transmission bus 410 in the electric power delivery system 400 before and after transmission line 414 is taken out-of-service at time 424. The angle 426 increases because power is rerouted as a result of transmission line 414 being taken out-of service. The transmission of rerouted power through other connections in electric power delivery system 400 is going through a larger impedance. As described above, the increase in the angle may be proportional to the increase in the impedance resulting from transmission line 414 being taken out-of-service.

FIG. 4C illustrates a graph over time showing an angle 428 equal to a difference between the second transmission bus 410 and the third transmission bus 412 in the electric power delivery system shown in FIG. 4A before and after the transmission line between the second 410 and third 412 transmission buses is taken out-of-service. As illustrated in FIG. 4C, the power across transmission line 416 becomes zero at time 424. The topography of electric power delivery system 400, together with the results shown in FIG. 4B and FIG. 4C may be used to determine that transmission line 414 was taken out-of-service.

Figure 5:
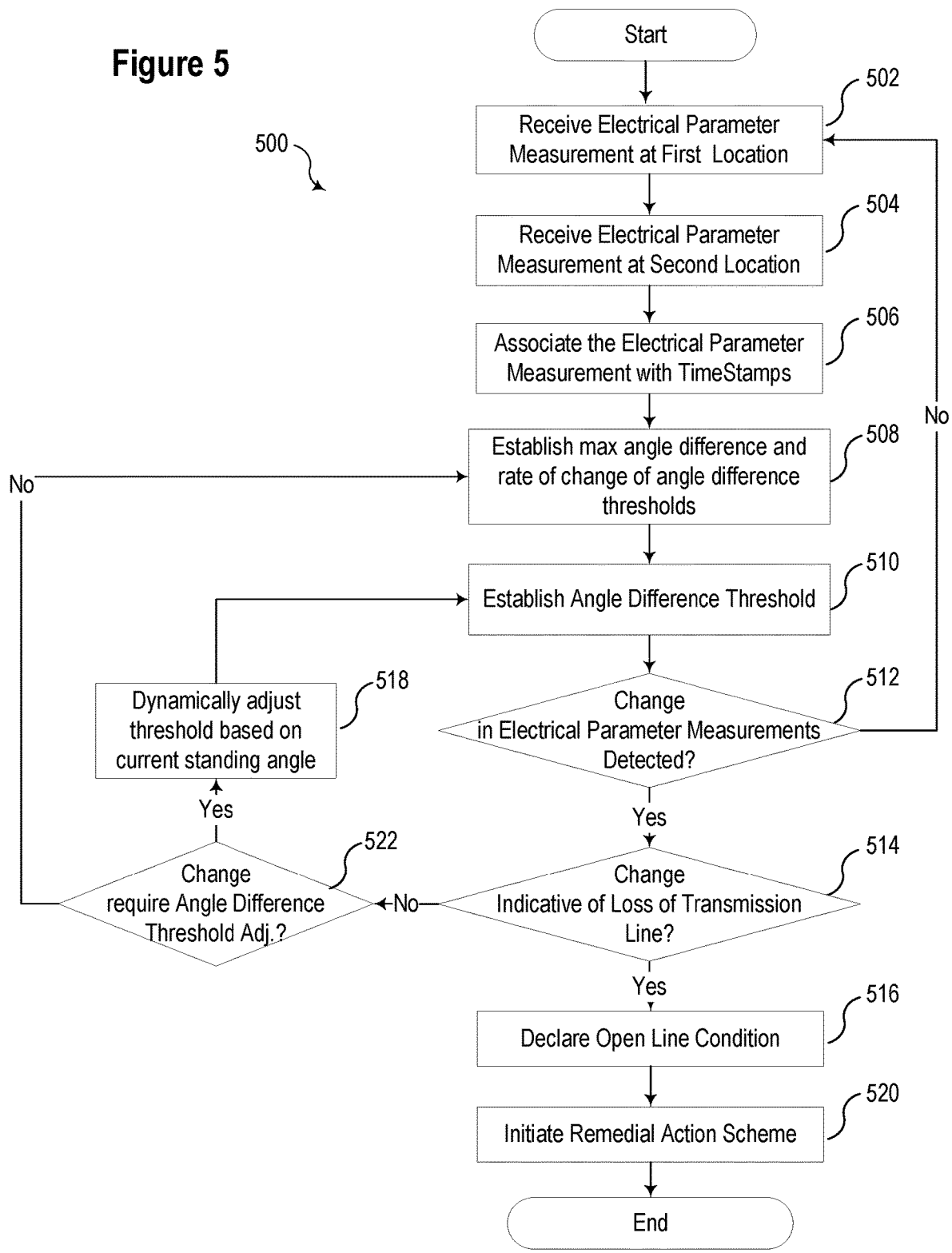
FIG. 5 illustrates a flow chart of a method for establishing a dynamically adjustable threshold for detecting loss of a parallel transmission line based on a standing angle difference between two buses consistent with embodiments of the present disclosure.

FIG. 5 illustrates a flow chart of a method 500 for establishing a dynamically adjustable threshold for detecting loss of a parallel transmission line based on a standing angle difference between two buses consistent with embodiments of the present disclosure. At 502, electric parameter measurements associated with the first location may be received. Similarly, at 504, electric parameter measurements associated with a second location may be received. In various embodiments, the electric parameter measurements may comprise voltage measurements, current measurements, angle measurements, power transfer measurements, etc. In some embodiments, two IEDs may be configured to acquire the electric parameter measurements at different locations in an electric power transmission system, and the measurements may be communicated using a data communication network. An exemplary configuration illustrating such a configuration is provided in FIG. 1 and described above. A standing angle difference may be determined between two buses in an electric power transmission system. The standing angle difference may be a reflection of the amount of power transferred between the two buses. Accordingly, as the power transferred between the two buses increases, the standing angle difference may also increase. Similarly, as the power decreases, the standing angle difference may decrease. Although method 500 refers specifically to a standing angle difference between buses, one of skill in the art will recognize that method 500 may be adapted for use in connection with other parameters.

At 506, the electric parameter measurements may be associated with time stamps. The time stamps may be generated by a receiving device or by a device configured to acquire the measurements. As described below, in connection with FIG. 7, certain IEDs may include a sensor component configured to generate time-stamped measurements of various electric parameters. Further, such IEDs may be configured to communicate such measurements with other devices to perform the various elements associated with method 500.

At 508, a maximum angle difference and rate of change of angle difference thresholds may be established that is suitable to maintain system stability. In other embodiments, the thresholds may be determined in other ways. Further, at 510, an initial angle difference threshold value may be established. In some embodiments, the threshold may depend on the time constrains needed to maintain transient stability in an electric power transmission system. As described below, the threshold value may be compared to the standing angle difference to determine whether an open line condition should be declared. An acceptable rate of change range may be established for the standing angle difference between the buses. The acceptable rate of change range may be determined by performing an analysis of a particular system. For example, a particular system may be analyzed to determine a rate of change during normal loading and unloading conditions. Based upon the rate of change during normal conditions, a threshold may be established that substantially exceeds the greatest rate of change during normal conditions. For example, the threshold may be set at two orders of magnitude higher than the rate of change experienced during normal conditions.

At 512, method 500 may determine whether a change in the electric parameter measurements is detected. In various embodiments, the electric parameter may be a standing angle difference between two parallel transmission lines. Determination of the standing angle difference may be performed using synchrophasors or other time-aligned data. The rate of change, in some embodiments, may be determined by comparing a current value to prior value. In other embodiments, the rate of change may be determined with reference to some number of prior samples. If no change is detected, method 500 may return to 502. If a change is detected, the change may be analyzed to determine whether the change is indicative of loss of at least one or more transmission lines.

At 514, method 500 may determine if the change does indicate loss of at least one or more transmission lines. If not, at 522, method 500 may determine if any change to a dynamically adjusting angle difference threshold is required. If so, the angle difference threshold is adjusted at 518, and the method returns to 510. If changes to the angle difference threshold are not required at 522, method 500 may return to 508.

If method 500 determines at 514 that the change in electrical parameter measurements are indicative of a loss of a transmission line, an open line condition may be declared at 516. In some embodiments, open line declaration may result in initiating a remedial action scheme ("RAS") at 520. The RAS may, for example, selectively disconnect or trip load or other components of the electric power transmission system to preserve system stability. Further, the RAS may include reconfiguring the electric power transmission system to re-route electric power around a transmission line that has been taken out-of-service. In still other embodiments, the remedial action may include initiating an alarm condition that notifies operators of the electric power transmission system of the open line condition. In various embodiments, determination of the standing angle may be performed using synchrophasors or other time-aligned data. The rate of change, in some embodiments, may be determined by comparing a current value to prior value. In other embodiments, the rate of change may be determined with reference to some number of prior samples.

The following example illustrates one embodiment of a dynamically adjustable threshold-based system consistent with the present disclosure. In the system, a standing angle difference of 2 degrees between two parallel transmission lines correspond to 900 MW of typical power transfer at 400 kV. In the system, power transfer may range anywhere between 0 to 2000 MW. A power transfer of 1800 MW in the system would result in a standing angle difference of 4 degrees (assuming there were no change in impedance and no significant change in voltage magnitudes). To satisfy stability constraints a tripping scheme must operate in less than 100 milliseconds. A field test measured that a synchrophasor-based angle difference element set to 4 degrees has operated in 92 milliseconds whereas an angle difference element set to 5 degrees for the same event has operated in 292 milliseconds.

Based on the parameters of the example set forth in the preceding paragraph, a threshold of 4 degrees cannot be used as it is within the range of typical power flow over that network and a threshold of 5 degrees cannot guarantee the system stability because the element would operate too slowly. Accordingly, a system consistent with the present disclosure may establish a dynamically adjustable threshold. For a power flow of 900 MW, the angle difference tripping element may dynamically set the threshold to be 4 degrees. As the power flow gradually increases to 1800 MW, the angle difference threshold will be gradually moved from its current threshold maintaining the same ratio between the angle difference and the power transfer.

Figure 6:
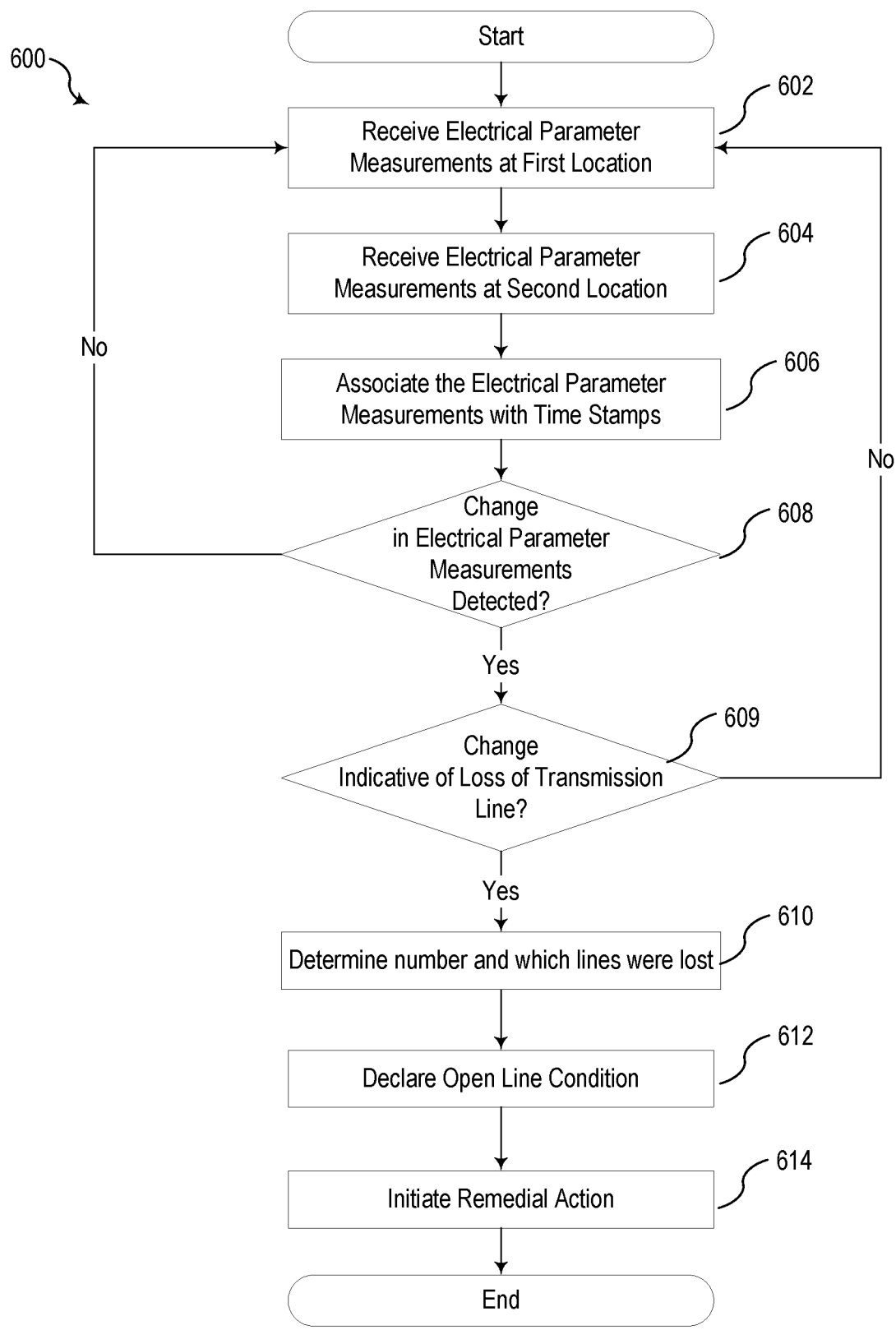
FIG. 6 illustrates a flow chart of a method for detecting loss of a transmission line based on a measured electric parameter and without reference to a fixed tripping threshold.

FIG. 6 illustrates a flow chart of a method 600 for detecting loss of a transmission line based on a measured electric parameter and without reference to any detection threshold. At 602, electric parameter measurements associated with a first location may be received. Similarly, at 604, electric parameter measurements associated with a second location may be received. In various embodiments, the electric parameter measurements may comprise voltage measurements, current measurements, angle measurements, power transfer measurements, etc. In some embodiments, two IEDs may be configured to acquire the electric parameter measurements at different locations in an electric power transmission system, and the measurements may be communicated using a data communication network. An exemplary configuration illustrating such a configuration is provided in FIG. 1 and described above.

At 606, the electric parameter measurements may be associated with time stamps. The time stamps may be generated by a receiving device or by a device configured to acquire the measurements. As described below, in connection with FIG. 7, certain IEDs may include a sensor component configured to generate time-stamped measurements of various electric parameters. Further, such IEDs may be configured to communicate such measurements with other devices to perform the various elements associated with method 600.

At 608, method 600 may determine whether a change in the electric parameter measurements is detected. If no change is detected, method 600 may return to 602. If a change is detected, the change may be analyzed to determine whether the change is indicative of a loss of one or more transmission lines. As discussed above in connection with FIG. 2, an initial jump in a standing angle difference between two points in an electric transmission system followed by a continued rise in the standing angle difference may be an indication that a transmission line has been taken out-of-service. On the other hand, however, as described in connection with FIG. 5, where a rate of change in the electrical parameters is relatively small, the change may simply reflect changing conditions within the loading/unloading conditions of the electric power transmission system.

When method 600 determines that the change in electrical parameters is indicative of the loss of a transmission line at 609, the number of transmission lines taken out-of-service and which specific transmission lines were taken out-of-service may be determined at 610. As described above, Eqs. 1-4 may be solved to determine the number of lines taken out-of-service. Further, as described in connection with FIGS. 3A-3C and FIGS. 4A-4C the response of the electric power transmission system and the topography of the system may be analyzed to identify the specific transmission lines that were taken out-of-service. If the change in electrical parameters is not indicative of the loss of a transmission line at 609, method 600 may return to 602.

At 612, open line condition may be declared and remedial action may be initiated at 614. In some embodiments, open line declaration may result in initiating a RAS controller that selectively disconnects loads or other components of the electric power transmission system to preserve system stability. Further, remedial action may include reconfiguring the electric power transmission system to re-route electric power around a transmission line that has been taken out-of-service. In still other embodiments, the remedial action may include initiating an alarm condition that notifies operators of the electric power transmission system.

Figure 7:
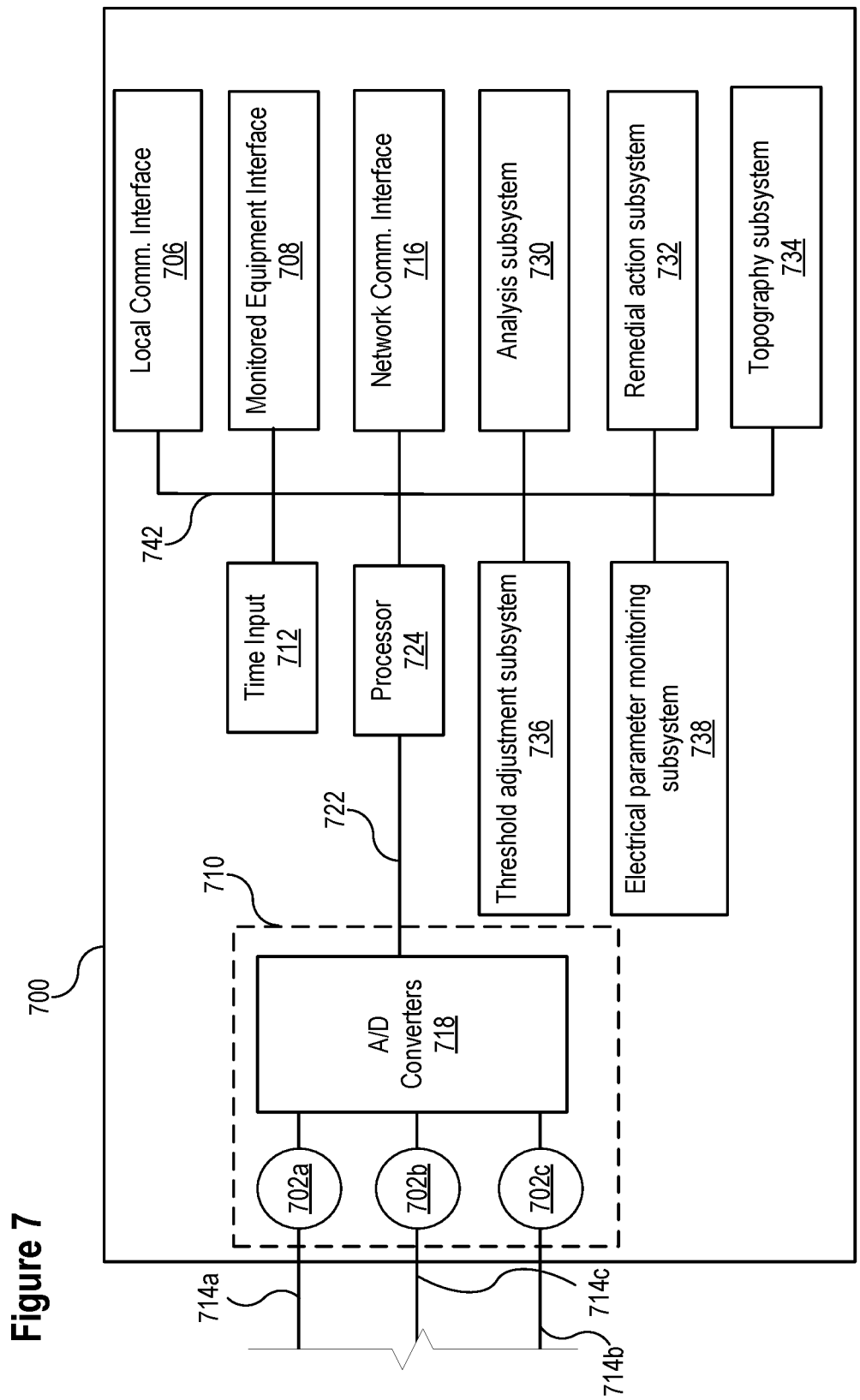
FIG. 7 illustrates a function block diagram of an IED configured to detect loss of transmission lines in electric power transmission systems consistent with embodiments of the present disclosure.

FIG. 7 illustrates a function block diagram of an IED 700 configured to detect loss of transmission lines in electric power transmission systems consistent with embodiments of the present disclosure. IED 700 may be configured to perform a variety of tasks using a configurable combination of hardware, software, firmware, and/or any combination thereof. The subsystems illustrated in FIG. 7 may be embodied as hardware using, for example, embedded systems, field programmable gate array implementations, and specifically designed integrated circuits. The subsystems illustrated in FIG. 7 may also be embodied using a combination of hardware and software. More specifically, a general purpose processor and a plurality of software modules may be configured to perform the various features and functions described herein. Moreover, certain components or functions described herein may be associated with other devices or performed by other devices. The specifically illustrated configuration is merely representative of one embodiment consistent with the present disclosure.

IED 700 includes a network communications interface 716 configured to communicate with other IEDs and/or system devices. In certain embodiments, the network communications interface 716 may facilitate direct communication with another IED or communicate with another IED over a communications network. The network communications interface 716 may facilitate communications with multiple IEDs. IED 700 may further include a time input 712, which may be used to receive a time signal allowing IED 700 to apply a time-stamp to the acquired samples. In certain embodiments, a common time reference may be received via communications interface 716, and accordingly, a separate time input may not be required for time-stamping and/or synchronization operations. One such embodiment may employ the IEEE 1588 protocol. A monitored equipment interface 708 may be configured to receive status information from, and issue control instructions to, a piece of monitored equipment. Such equipment may include, for example, breakers, reclosers, or other devices configured to selectively connect or disconnect a portion of an electric power transmission system.

A local communication interface 706 may also be provided for local communication with IED 700. The local communication interface 706 may be embodied in a variety of ways, including as a serial port, a parallel port, a Universal Serial Bus (USB) port, an IEEE 1394 Port, and the like.

In certain embodiments, IED 700 may include a sensor component 710. In the illustrated embodiment, sensor component 710 is configured to gather data directly from a plurality of conductors 714*a-c* and may use, for example, A/D converters 718 that may sample and/or digitize filtered waveforms to form corresponding digitized current and voltage signals provided to data bus 722. Conductors 714*a-c* may be electrically connected to an electric power transmission system. In some embodiments transformers (not shown) may reduce the voltage or current to a level appropriate for monitoring using the IED 700. A/D converters 718 may include a single A/D converter or separate A/D converters for each incoming signal. A current signal may include separate current signals from each phase of a three-phase electric power system. A/D converters 718 may be connected to processor 724 by way of data bus 722, through which representations of electric parameters determined by sensor elements 702*a-c* may be transmitted to processor 724. In various embodiments, the representations of electric parameters may represent parameters, such as currents, voltages, frequencies, phases, and other parameters associated with an electric power transmission system. Sensor elements 702*a-c* may represent a variety of types of elements, such as voltage transformers, current transformers, status inputs, a breaker controller, etc.

Processor 724 may be configured to process communications received via communications interface 716, time input 712, monitored equipment interface 708, and/or sensor component 710. Processor 724 may operate using any number of processing rates and architectures. Processor 724 may be configured to perform various algorithms and calculations described herein. Processor 724 may be embodied as a general purpose integrated circuit, an application specific integrated circuit, a field-programmable gate array, and/or any other suitable programmable logic device.

An electric parameter monitoring subsystem 738 may be configured to monitor specified electric parameters and to determine whether a change in the electric monitored parameters is detected. In various embodiments, the electric parameters may be received directly from sensor component 710. In other embodiments, the parameters may be received via the network communication interface 716, the monitored equipment interface 708 or the local communication interface 706.

When a change is detected by the electric parameter monitoring subsystem 738, the analysis subsystem 730 may be configured to analyze the changes to determine whether the changes indicate that one or more transmission lines have been taken out-of-service. In one specific embodiment, analysis subsystem 730 may be configured to solve Eqs. 1-4 to determine a number of lines taken out-of-service. Further, as described in connection with FIGS. 3A-3C and FIGS. 4A-4C the response of the electric power transmission system and the topography of the system may be analyzed to identify the specific transmission lines that were taken out-of-service. Topography subsystem 734 may be configured to provide information relating to the topography of an electric power transmission system to aid in the determination of which transmission line has been taken out-of-service.

A remedial action subsystem 732 may be configured to implement one or more actions in response to a determination that one or more transmission lines have been taken out-of-service. Specifically, remedial action subsystem 732 may be configured to selectively disconnect loads or other components of the electric power transmission system to preserve system stability. Further, remedial action subsystem 732 may, in conjunction with topography subsystem 734, reconfigure the electric power and transmission system to re-route electrical power around a transmission line that has been taken out-of-service. In still other embodiments, remedial action subsystem 732 may initiate an alarm that notifies operators of the electric power transmission system that a transmission line has been taken out-of-service.

A threshold adjustment subsystem 736 may be configured to establish and adjust a dynamic threshold that may be used for detecting loss of a transmission line. In one specific embodiment, threshold adjustment subsystem 736 may be configured to implement the specific method illustrated in FIG. 5 and described in detail above.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A system configured to determine a status of an electric power transmission line in an electric power transmission system, the system comprising:
   an electrical parameter monitoring subsystem configured to:
     receive a first plurality of electrical parameter measurements taken at a first location over a first period of time;
     receive a second plurality of electrical parameter measurements taken at a second location over the first period of time;
     establish at least one rate of change of angle difference threshold and one angle difference threshold;
   a threshold adjustment subsystem configured to:
     determine a first rate of change based on the first plurality of electrical measurements and the second plurality of electrical measurements over the first period of time;
     determine that the first rate of change is within the at least one rate of change of angle difference threshold;
     dynamically adjust the angle difference threshold based on the first rate of change;
   an analysis subsystem configured to determine that the electric power transmission line is in-service.

2. The system of claim 1, wherein the angle difference threshold is established using one of a standing angle difference between two points in the electric power transmission system, and a power transfer value between two points in the electric power transmission system.

3. The system of claim 2, wherein the two points comprise transmission buses in the electric power transmission system separated by the electric power transmission line.

4. The system of claim 1, wherein:
   the electrical parameter monitoring subsystem is further configured to receive a third plurality of electrical parameter measurements taken at the first location and a fourth plurality of electrical parameter measurements taken at the second location over a second period of time;
   the threshold adjustment subsystem is further configured to determine a second rate of change based on the third plurality of electrical measurements and the fourth plurality of electrical measurements over the second period of time;
   the analysis subsystem is further configured to determine that the second rate of change is outside of the at least one rate of change of angle difference threshold; and
   the system further comprises a remedial action subsystem configured to initiate a remedial action based on the determination that the second rate of change is outside of the at least one rate of change threshold.

5. The system of claim 1, wherein the threshold adjustment subsystem is further configured to establish a margin value preserve transient stability and to compare the margin value to the first rate of change.

6. A method of determining a status of an electric power transmission line in an electric power transmission system, the method comprising:
   establishing a threshold value of an electric parameter;
   establishing a margin value suitable to maintain stability of the electric power transmission system;
   establishing a rate of change range of the electric parameter;
   determining a first present value of the electric parameter associated with an electric transmission line;
   determining a first rate of change of the electric parameter associated with the electric transmission line;
   determining that the first rate of change is within the rate of change range;
   determining that the first present value of the electric parameter is below the sum of the threshold value of the electric parameter and the margin value;
   dynamically adjusting the threshold value based on the present value of the electric parameter; and
   determining that an electric power transmission line is in-service.

7. The method of claim 6, wherein the initial threshold value comprises one of a standing angle difference between two points in the electric power transmission system, and a power transfer value between two points in the electric power transmission system.

8. The method of claim 7, wherein the two points comprise transmission buses in the electric power transmission system separated by the electric power transmission line.

9. The method of claim 6, further comprising:
   determining a second present value of the electric parameter;
   determining a second rate of change of the electric parameter;
   determining that the second rate of change is outside of the rate of change range;
   initiating a remedial action.

10. The method of claim 6, further comprising:
determining a second present value of the electric parameter;
determining that the second present value of the electric parameter exceeds the sum of the threshold value of the electric parameter and the margin value; and
determining that the electric power transmission line is out-of-service.

11. The method of claim 6, wherein the margin value is established to preserve transient stability.

* * * * *